United States Patent [19]

Ekdahl

[11] 4,438,394
[45] Mar. 20, 1984

[54] CAPACITIVELY-COUPLED INDUCTIVE SENSOR

[75] Inventor: Carl A. Ekdahl, Albuquerque, N. Mex.

[73] Assignee: The United States of America as represented by the United States Department of Energy, Washington, D.C.

[21] Appl. No.: 253,490

[22] Filed: Apr. 13, 1981

[51] Int. Cl.³ .................... G01R 19/28; G01R 15/00
[52] U.S. Cl. ...................................... 324/126; 324/95
[58] Field of Search ................ 324/126, 95; 333/24 C

[56] References Cited

U.S. PATENT DOCUMENTS 4,241,373  12/1980  Mara et al. ......................... 324/126

OTHER PUBLICATIONS

Ekdahl, C. A.; "Capacitively-Coupled . . . "; Rev. Sci. Instrum.; 51(12); Dec. 1980; pp. 1649-1651.

Ekdahl, C. A.; "Voltage and Current Sensors . . . "; Rev. Sci. Instrum.; 51(12); Dec. 1980; pp. 1645-1648.
Leavit et al.; "Ultrafast High Voltage Probe"; Rev. Sci. Instrum.; vol. 36; 1965; p. 1371-1372.
Harris, N. W.; "High Voltage Probe . . . "; Rev. Sci. Instrum.; vol. 45; 1974; pp. 961-962.

Primary Examiner—Ernest F. Karlsen
Attorney, Agent, or Firm—Leonard C. Brenner; Paul D. Gaetjens; Michael F. Esposito

[57] ABSTRACT

A capacitively coupled inductive shunt current sensor which utilizes capacitive coupling between flanges having an annular inductive channel formed therein. A voltage dividing capacitor is connected between the coupling capacitor and ground to provide immediate capacitive division of the output signal so as to provide a high frequency response of the current pulse to be detected. The present invention can be used in any desired outer conductor such as the outer conductor of a coaxial transmission line, the outer conductor of an electron beam transmission line, etc.

1 Claim, 3 Drawing Figures

CAPACITIVELY-COUPLED INDUCTIVE SENSOR

BACKGROUND OF THE INVENTION

This invention pertains generally to measuring and testing devices and more particularly to sensors for detecting pulsed currents and pulsed magnetic fields. This invention is a result of a contract with the Department of Energy (Contract W-7405-ENG-36).

In many experiments it is frequently desirable to detect the time varying magnitude of high-pulsed currents and high-pulsed magnetic fields. Typically, inductive magnetic field sensors are employed which generate high output voltage signals which are difficult to detect with a high frequency response. For example, large area diamagnetic loop detectors are used in high energy theta pinch experiments which have magnetic field rates of change in excess of 10 kG/$\mu$s and which produce tens to hundreds of kilovolts in the loop output terminals, such as disclosed by T. S. Green, Nucl. Fus. 2, 92(1962) and R. J. Commisso et al., Phys. Rev. Letters 39, 137(1977). Experiments with rapid plasma heating using intense relativitic electron beams also produce high voltage diamagnetic loop signals such as disclosed by C. Ekdahl et al., Phys. Rev. Letters 33, 346(1974) and M. Greenspan, Phys. Fluids 23, 205(1980), as well as fast, high density z-pinch experiments such as disclosed by J. E. Hammel, Los Alamos Scientific Laboratory report LA-6203-MS (1976) and intense relativistic electron beam experiments such as disclosed by J. A. Nation, Particle Accelerators 10, 1(1979) which produce currents that can have rates of change in excessof 10 kA/ns. These current measurements are particularly troublesome if the inductive sensor must by necessity be located proximate to a high current density beam. Additionally, prior art resistive divider circuits for reducing the output voltage for measurement have been susceptible to surface tracking and breakdown, have caused shunting of the load with a lower impedance, have caused destortion of the fields in the region of measurement, and have required careful balancing of resistive and capacitive elements or complicated voltage grading structures.

Furthermore, the appearance of the full induced voltage across the output terminals of the inductive sensors such as flux loops such as disclosed by R. H. Lovberg, in "Plasma Diagnostic Techniques," Ed. by R. H. Huddlestone and S. L. Leonard, (Academic Press, New York, 1965) pp. 69–112 and R. L. Copeland et at., Rev. Sci. Instrum. 50, 233(1979), Rogowski Belts such as disclosed by W. Rogowski et al., Arch. Electrotech. 1, 141(1912) and D. Honea et al., J. Phys. E. 7, 537(1974) and inductive shunts such as disclosed by C. A. Ekdahl, Los Alamos Scientific Laboratory report LA-UR-80-1288 (1980), imposes severe requirements on the insulation strength near the output. Since the induced voltage at the output terminals of these devices is equal to the product of the time-rate-of-change of the magnetic field and the flux linking area of the sensor, a common solution to reducing the voltage at the output terminals is to make the area of the sensor smaller such as disclosed by M. C. Clark, Bull. Am. Phys. Soc. 22, 1100(1977). There is, however, a minimum size that can be uutilized for any application. Diamagnetic loops encircling a plasma volume or insulating vacuum vessel cannot be effectively reduced in size, and there is a minimum size for inductive current sensors, such as Rogowski belts, dictated by the sensitivity of these devices to unwanted field components.

SUMMARY OF THE INVENTION

It is therefore an object of the present invention to provide a capacitively-coupled inductive shunt current sensor.

It is also an object of the present invention to provide a capacitively-coupled inductive sensor for detecting pulsed currents;

It is another object of the present invention to provide a capacitively-coupled inductive sensor for detecting pulsed currents generated in a coaxial transmission line;

Another object of the present invention is to provide a capacitively-coupled inductive shunt current sensor which has inherent noise immunity;

Another object of the present invention is to provide a capacitively-coupled inductive shunt current sensor which has a compact construction;

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects, and in accordance with the purpose of the present invention, as embodied and broadly described herein, the apparatus of this invention may comprise a capacitively coupled inductive shunt current sensor comprising: annular inductive channel means formed in a conductor carrying a high voltage pulsed current; an electrode capacitively coupled to said conductor on opposite sides of said annular inductive channel means; voltage dividing capacitor means connected in series with said electrode for reducing and magnitude of the detected output signal; output coupling means connected to said voltage dividing capacitor means for producing an output signal representative of said high voltage pulsed current.

The present invention may also comprise in accordance with its objects and purposes a capacitively coupled inductive sensor for detecting pulsed currents generated in a coaxial transmission line having an inner and outer conductor comprising first and second flanges formed in said outer conductor of said coaxial transmission line; and insulator disposed between said first and second flanges capable of insulating said first and second flanges for all voltages generated between said flanges; an annular inductive channel formed in said second flange; and electrode disposed in said first flange adjacent to said insulator such that said electrode is capacitively coupled to said second flange; a feedthrough capacitor coupled between said electrode and said first flange; output means for providing an output signal proportional to and having a substantially reduced magnitude from said pulsed current.

The advantages of the present invention are that capacitive coupling provides an ideal geometry for high voltage insulation, and furthermore, results in an immediate capacitive division of the output signal that obviates the need for further voltage dividers. Additionally, the design of the present invention provides inherent noise immunity and compact construction.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings.

DETAILED DESCRIPTION OF THE PREFERRED EMBODIMENT OF THE INVENTION

Figure 1:
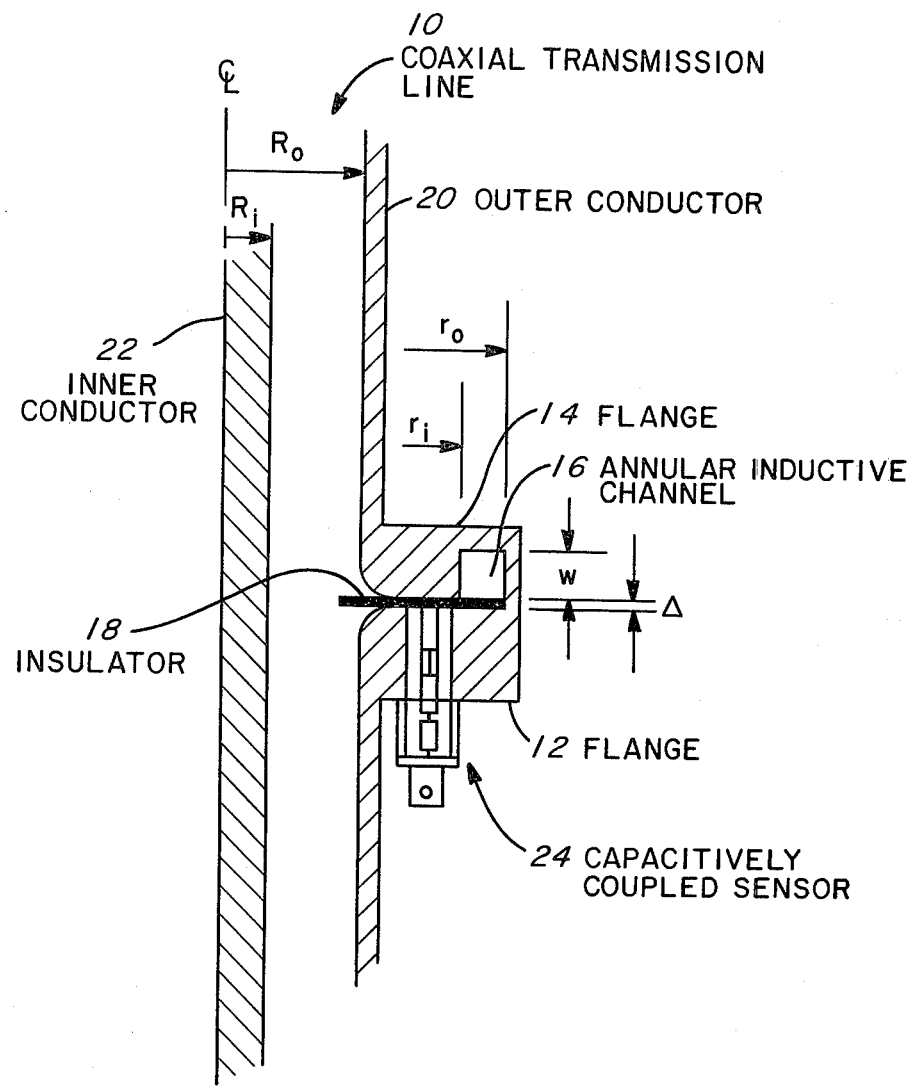
FIG. 1 is a cross-sectional view of the inductive shunt current sensor of the present invention.

FIG. 1 schematically illustrates the capacitively coupled inductive shunt current sensor of the present invention. FIG. 1 illustrates one-half of a coaxial transmission line or electron beam transmission line 10 with a pair of mating flanges 12 and 14 formed in the outer conductor. An annular inductive channel 16 is formed in the flange 14.

The flanges 12 and 14 are separated by insulator 18 which protrudes into the coaxial transmission line to prevent surface tracking. Insulator 18 causes the current in the outer conductor 20 to flow around the flanges 12 and 14 and around the annular inductive channel means 16. When a high voltage pulse current is applied to the coaxial transmission line 10 the annular inductive channel means produces a small inductance which causes a voltage difference to be induced between flanges 12 and 14 by the time variation of the magnetic flux in the annular channel. This voltage can then be detected by the capacitively coupled sensor 24 that is recessed into flange 12 and is capacitively coupled to flange 14 through insulator 18.

Figure 2:
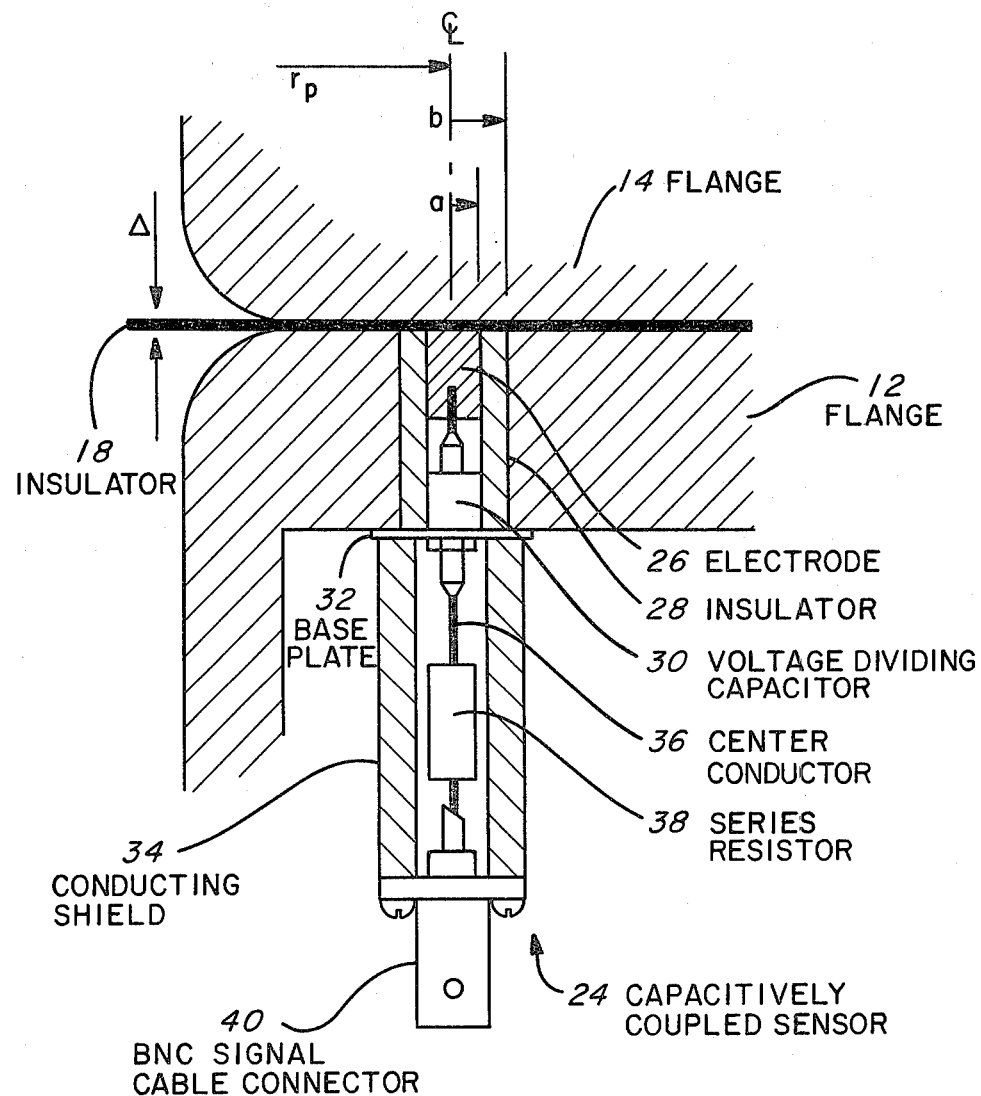
FIG. 2 is detailed cross-sectional view of the inductive shunt current sensor of the present invention.

FIG. 2 is a close-up view of the capacitively coupled sensor 24 and portions of flanges 12 and 14. The thin mylar dielectric insulator 18 has a predetermined thickness which provides an insulation strength exceeding the maximum voltage produced between the flanges. A cylindrically-shaped electrode 26 is recessed flange 12 and in a cylindrically-shaped teflon sleeve insulator 28. Electrode 26 is disposed adjacent the insulator 18. Voltage dividing capacitor 30 provides capacitance between the center conductor 36, which is connected to electrode 26, and flange 12. The outer shield of voltage dividing capacitor 30 is grounded to flange 12 by way of base plate 32. The conducting shield 34 is also grounded to flange 12 and provides a suitable support for BNC signal cable connector 40 as well as providing shielding for the capacitively coupled inductive shunt current sensor of the present invention. Series resistor 38 is connected between voltage dividing capacitor 30 and BNC signal cable connector 40, and provides an additional voltage drop in the output signal.

The present invention can be constructed and elements used to provide the desired output suitable for the intended use of the present invention. A specific example of implementation of the present invention is disclosed in Rev. Sci. Instrum. 51, (12), December 1980, which discloses the specific parameters which can be used in accordance with the present invention. This citation is hereby incorporated by reference into this disclosure.

Figure 3:
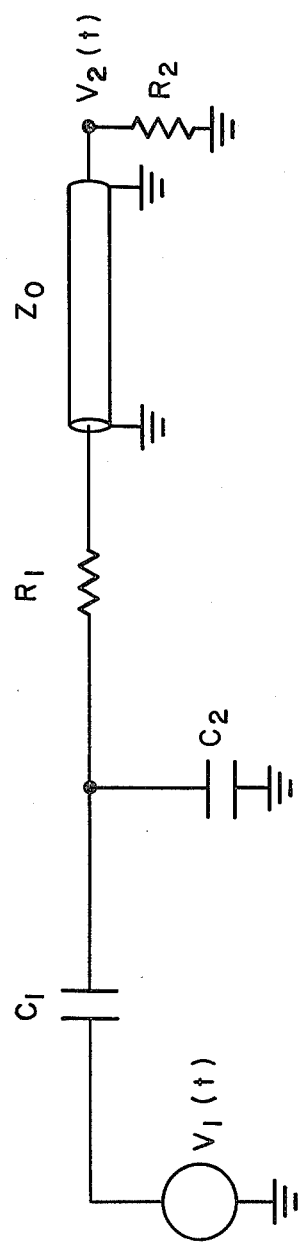
FIG. 3 is a schematic drawing of the equivalent circuit diagram of the device of the present invention.

FIG. 3 is a schematic diagram of the equivlalent circuit of the capacitively coupled inductive shunt current sensor of the present invention. $V_1(t)$ comprises the voltage generated between flanges 12 and 14 resulting from the annular inductive channel 16 illustrated in FIG. 1. The coupling capacitance, $C_1$, is the capacitance between electrode 26 and lange 14. The capacitance formed in this manner is equivalent to an essentially well-guarded parallel plate capacitor. $C_2$ is essentially the capacitance provided by voltage dividing capacitor 30 since stray capacitance between the electrode, center conductor, etc., and flange 12 is negligible. $R_1$ is essentially the resistance provided by series resistor 38. $Z_o$ is the impedance of the coupling cable connected to BNC signal cable connector 40 and $R_2$ is the resistance of the measuring device, such as an oscilloscope. $V_2(t)$ comprises the measured output voltage.

$C_1$ and $C_2$ function to divide the detected voltage by the ratio of their magnitudes. Consequently, not only can the magnitude of the detected voltage be determined by the parameters of electrode 26 and insulator 18 but also by the magnitude of voltage dividing capacitor 30 which essentially shunts excess voltage to ground (flange 12).

The present invention therefore provides a capacitively coupled inductive shunt current sensor which is capable of detecting high magnitude pulsed currents using high frequency response devices which are easy and inexpensive to implement. The problems and expense associated with diamagnetic loop type detectors, such as the problems encountered in the use of resistive dividers, are overcome by the present invention which has inherent noise immunity and compact construction. The present invention provides an ideal geometry for high voltage insulation and also accomplishes the necessary voltage division by immediate capacitive division of the output signal without the need for further external voltage dividers.

The foregoing description of a preferred embodiment of the invention has been presented for purposes of illustration and description. It is not intended to be exhaustive or to limit the invention to the precise form disclosed, and obviously many modifications and variations are possible in light of the above teaching. For example, capacitively coupled diamagnetic loops can be used in accordance with the present invention for the measurement of plasma diamagnetism in rapid plasma heating experiments and high voltage theta pinches. Capacitive detectors embedded in the theta pinch collector plates near the compression coil feed slot can produce a usable diamagnetic signal if the energy transfer efficiency is sufficiently low, or the plasma size or diamagnetism is sufficiently large. The outputs of several such detectors spaced along the length of the coil can be combined to provide a measurement of the total magnetic moment or internal energy of the plasma. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A capacitively coupled inductive sensor for detecting a pulsed current generated in a coaxial transmission line having an inner and outer conductor comprising:

first and second flanges formed in said outer conductor of said coaxial transmission line;
an insulator disposed between said first and second flanges capable of insulating between a portion of said first and second flanges;
an annular inductive channel formed in said second flange contiguous to said insulator, so that current flowing between said first and second flanges flows around said insulator and said annular inductive channel;

an electrode disposed in said first flange adjacent said insulator such that said electrode is capacitively coupled to said second flange;
a feedthrough capacitor capacitively coupling said electrode to said first flange; and
output means coupled to said feedthrough capacitor for providing an output signal proportional to and having a substantially reduced magnitude from said pulsed current.

* * * * *